(12) United States Patent
Kirchdoerffer et al.

(10) Patent No.: US 7,586,303 B2
(45) Date of Patent: Sep. 8, 2009

(54) INDUCTIVE PROXIMITY SENSOR

(75) Inventors: Remy Kirchdoerffer, Vufflens le Chateau (CH); Vladimir Frolov, Strasbourg (FR)

(73) Assignee: Senstronic, Saverne (FR)

( * ) Notice: Subject to any disclaimer, the term of this patent is extended or adjusted under 35 U.S.C. 154(b) by 347 days.

(21) Appl. No.: 11/090,161

(22) Filed: Mar. 28, 2005

(65) Prior Publication Data

US 2005/0212510 A1  Sep. 29, 2005

(30) Foreign Application Priority Data

Mar. 26, 2004  (EP) ................... 04360032

(51) Int. Cl.
  *G01B 7/14* (2006.01)
(52) U.S. Cl. .............. 324/207.26; 324/207.16
(58) Field of Classification Search ............ 324/207.26, 324/207.15, 207.16, 207.17, 207.24
  See application file for complete search history.

(56) References Cited

U.S. PATENT DOCUMENTS

| | | | | |
|---|---|---|---|---|
| 4,879,512 A | * | 11/1989 | Leonard et al. | ........ 324/207.16 |
| 4,893,076 A | * | 1/1990 | Leonard et al. | ........ 324/207.17 |
| 5,801,530 A | * | 9/1998 | Crosby et al. | .......... 324/207.26 |
| 2001/0032650 A1 | * | 10/2001 | Legay | ........................ 128/906 |
| 2003/0016008 A1 | * | 1/2003 | Christensen | ........... 324/207.26 |
| 2005/0094346 A1 | * | 5/2005 | Kirchdoerffer | .............. 361/143 |

FOREIGN PATENT DOCUMENTS

| | | |
|---|---|---|
| DE | 21 19 507 | 10/1972 |
| EP | 0 156 696 | 10/1985 |
| EP | 1 168 626 | 1/2002 |
| EP | 1293806 A2 * | 3/2003 |
| FR | 2604251 A1 * | 3/1988 |

* cited by examiner

*Primary Examiner*—Patrick J Assouad
*Assistant Examiner*—David M. Schindler
(74) *Attorney, Agent, or Firm*—Young & Thompson (57) ABSTRACT

An inductive proximity sensor includes a coil or inductance arranged in the vicinity of an active surface or end of the sensor, a current source repeatedly supplying the inductance, and a signals processor for signals corresponding to the voltages induced in the coil when fed. The induced voltages are influenced by the presence of objects within a given detection area, depending on their distance and on their constituting material. The coil or inductance is part of a parallel LC circuit. The current source is the capacitor of the LC circuit. A voltage signal amplitude measurement is performed after each switch from charge to discharge state. The result is computed using reference measurements to calculate a distance, a nature of the constituting material, and/or mass indicative value of the objects.

14 Claims, 5 Drawing Sheets

INDUCTIVE PROXIMITY SENSOR

BACKGROUND OF THE INVENTION

The present invention concerns the field of electromagnetic based detection and sensing, in particular in an industrial environment, and relates particularly to an inductive proximity sensor or switch.

More specifically, the present invention concerns an inductive sensor of the type comprising:
- an inductive coil defining a front working plane of the sensor and associated with a covering plate or a plane part of a housing, said plate or part being made of a non magnetic metal with low electrical conductivity, said plate or part being disposed perpendicularly to the coil axis and parallel to its front working plane,
- means for supplying the coil or inductance repeatedly with current,
- means for processing signals which correspond to the voltages induced in said coil or inductance when fed, said induced voltages being influenced by the presence of objects or bodies within a given detection area, depending on their distance and on their constituting material(s), and said coil or inductance being part of a LC circuit.

Inductive proximity switches using a resonant circuit are already known. The working principals of this type of sensors are as follows.

When no metallic object is near the sensor (in the detection area of the sensor), the measuring circuit comprised of an oscillator working at resonance conditions oscillates at its maximum amplitude. When a metallic object approaches the active part of the switch, it generates losses by Foucault currents induced in said object and thus a decrease of the amplitude of the resonance.

By comparing this decreased amplitude with a reference value it is possible to detect the presence of metallic objects.

An example of a sensor of the type described before is disclosed in U.S. Pat. No. 4,893,076.

The main disadvantage of the sensor proposed in said U.S. document resides in the necessity of an oscillator of high quality, to provide a sensor launching with a relatively low threshold. This solution can not be used with detectors in fully metal housings, as in these cases the quality of the oscillator would strongly decrease (because of the additional energy absorption in the metallic face part).

Figure 7A:
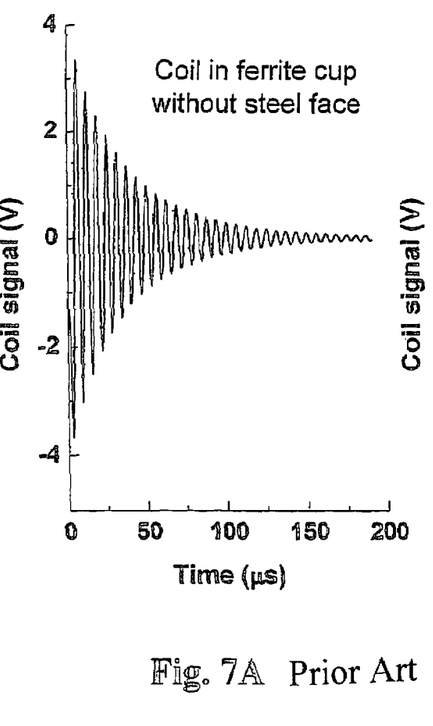
Figure 7B:
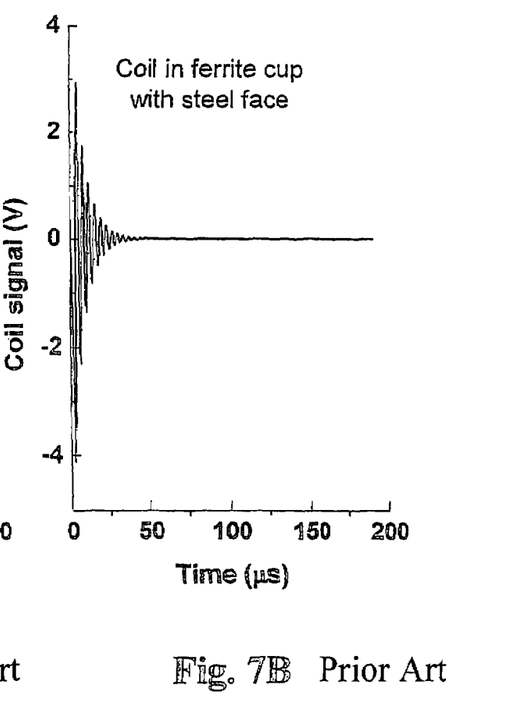

This phenomenon is illustrated by comparing FIGS. 7A and 7B of the enclosed drawings, which show the oscillograms of the voltage from two identical LC circuits with identical coils. The only difference between the devices which provided the signals shown in these figures is the presence of an additional stainless steel non magnetic plate (1 mm thick) in the device providing the signal of FIG. 7B, said plate having been placed on the coil of the LC circuit of said device.

Thus, one can clearly recognise that the stainless steel plate modifies not only the quality of the oscillator but also the frequency of the signal oscillations. This metal part must therefore be treated not only as a mechanical or physical part of the sensor but also as an essential part of the electric components forming the oscillating circuit, said plate strongly influencing on the quality and the frequency of the oscillator.

Another type of inductive proximity switch is known from European patent specification EP-A-0 492 029. In this proximity switch, a coil is directly supplied with periodical transmitting current pluses. The effective signal is obtained by a suitable electronic circuit which responds to the received voltage induced in said coil by the decaying of the current which previously flows in the detected body due to the voltage induced therein by the transmitting current pulse.

In an embodiment of the proximity switch known from EP-A-0 492 029, the aforementioned voltage induced in the coil is integrated over a relatively short time window in order to obtain a smoothened useful signal after suitable processing. This signal is compared to a reference voltage in order to generate an output signal which signals the presence of a detected body in the vicinity of the proximity switch if such a body is present. Such a proximity switch provides a good switch distance in the detection of metallic bodies, e.g. of aluminium or steel.

Nevertheless, the inductive proximity switch of EP-A-0 492 029 needs a precise signal generator able to deliver the periodic current to the coil and evaluates measurement values acquired almost immediately after interruption of the current in the coil, and thus during a transitional state which is not necessarily reproduced identically from one period to the next. This results in errors in detection and sensing.

Furthermore, U.S. Pat. No. 6,133,654 discloses an inductive proximity switch of the kind described in European patent specification EP-A-0 492 029 which is suitable for use under conditions of mechanical stresses exerted on the active surface of the proximity switch, in aggressive environments, and under high ambient pressure, and which still provides a good switching distance in the detection of metallic bodies, e.g. of aluminium or steel.

In order to achieve the set goal, this US document provides an inductive proximity switch of the kind described in European patent specification EP-A-0 492 029 wherein said coil, said circuit for supplying the coil with a periodical transmitting current, and said means for processing said signals are arranged in a cylindrical housing which is closed on the side of the active surface of the proximity switch and which consists of a metal which is not ferromagnetic and whose specific electric resistance is relatively high.

It is an aim of the present invention to provide an inductive proximity sensor of the type set forth herein before, which overcomes the limitations of the state of the art known from U.S. Pat. No. 4,893,076, EP-A-0 492 029 and U.S. Pat. No. 6,133,654, i.e. which provides accurate and reliable results and is of simple construction.

SUMMARY OF THE INVENTION

Therefore the present invention concerns such an inductive proximity sensor characterised in that the supplying means consist basically of the capacity or capacitor of the LC circuit, and in that the LC circuit is repeatedly switched between two states, namely a first state in which the coil or inductance is disconnected from the capacity and said capacity is charged and a second state in which the coil or inductance is connected to the capacity and said capacity discharges through said coil or inductance, the LC circuit being allowed to freely oscillate while in said second state and until the following change of state and the effective circuit parameters, and thus the oscillating voltage signal, being modified by the object(s) and/or body(ies) located within the detection area, and in that a voltage signal amplitude measurement is performed at a certain predefined point of said oscillating voltage signal after each switching from the first to the second state (i.e. at a certain time after each switching) and the result of said measurement is computed in connection with reference measurements in order to calculate the distance to the active surface or end of the sensor, the nature of the constituting material(s), and/or a mass indicative value of the object(s) or body(ies) located within the detection area.

BRIEF DESCRIPTION OF THE DRAWINGS

The invention will be better understood thanks to the following description and drawings of embodiments of said invention given as non limitative examples thereof.

In the accompanying drawings.

DETAILED DESCRIPTION OF THE PREFERRED EMBODIMENTS

Figure 1:
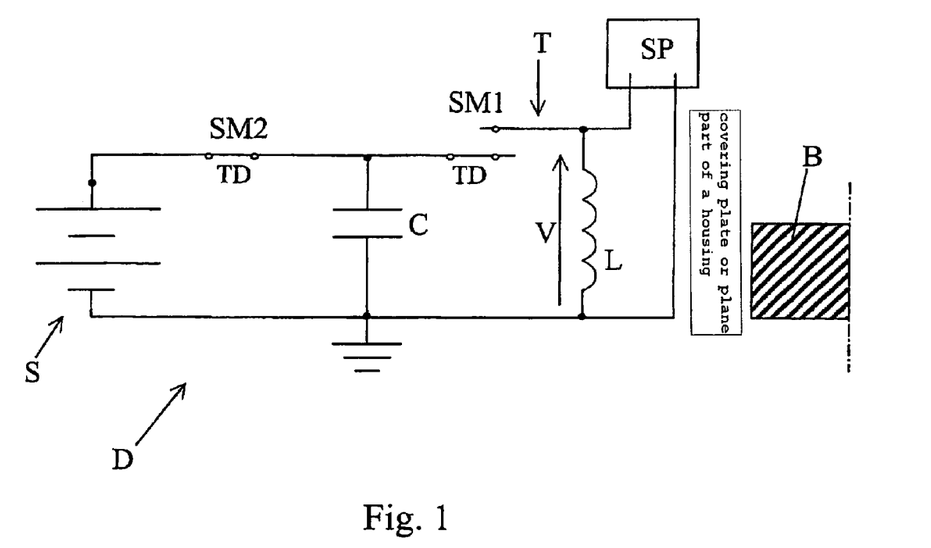
FIG. 1 is a schematical drawing of a first embodiment of a sensor according to the invention.
Figure 2A:
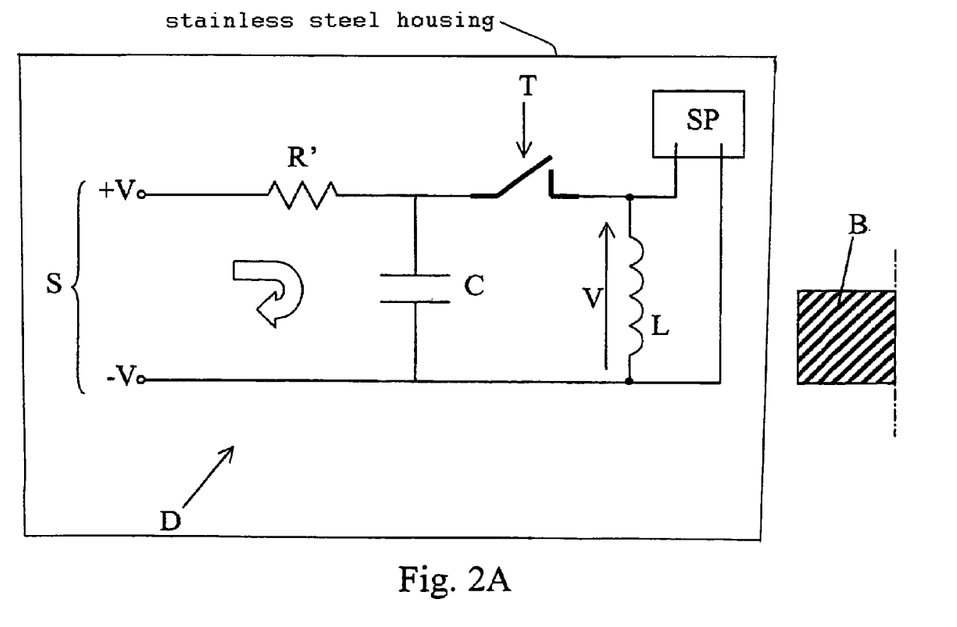
FIGS. 2A and 2B are schematical drawings of a second embodiment of a sensor according to the invention, wherein the LC circuit is respectively in the first state (figure A2) and in the second state (FIG. 2B)
Figure 2B:
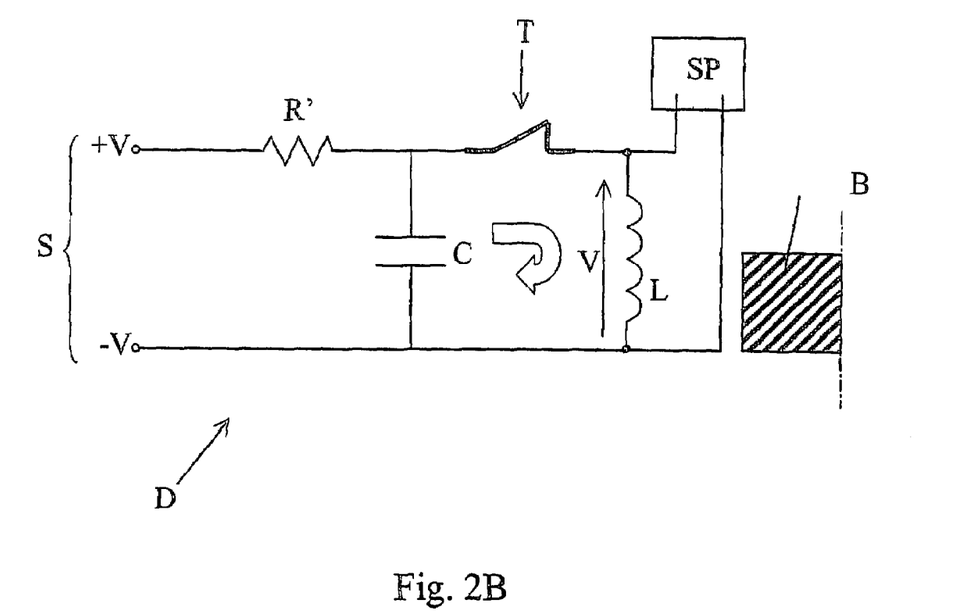

As shown in FIGS. 1, 2A and 2B, the inductive proximity sensor D comprises:

- an inductive coil L defining a front working plane of the sensor D and associated with a covering plate or a plane part of a housing, said plate or part being made of a non magnetic metal with low electrical conductivity, said plate or part being disposed perpendicularly to the coil axis and parallel to its front working plane, and thus forming part of the equivalent magnetic circuit,
- means C, S for supplying the coil or inductance repeatedly with current,
- means SP for processing signals which correspond to the voltages V induced in said coil or inductance L when fed, said induced voltages V being influenced by the presence of objects or bodies B within a given detection area, depending on their distance and on their constituting material(s), and said coil or inductance L being part of a parallel LC circuit.

According to the invention, said supplying means consist basically of the capacity or capacitor C of the LC circuit. The LC circuit is repeatedly switched between two states, namely a first state in which the coil or inductance L is disconnected from the capacity C and said capacity C is charged and a second state in which the coil or inductance L is connected to the capacity C and said capacity C discharges through said coil or inductance L, the LC circuit being allowed to freely oscillate while in said second state and until the following change of state and the effective circuit parameters, and thus the oscillating voltage signal, being modified by the possible object(s) and/or body(ies) B located within the detection area, and in that a voltage signal amplitude measurement is performed at a certain predefined point of said oscillating voltage signal after each switching from the first to the second state and the result of said measurement is computed in connection with reference measurements in order to calculate the distance to the front working plane forming the active surface or end of the sensor D, the nature of the constituting material(s), and/or a mass indicative value of the object(s) or body(ies) B located within the detection area.

Said sensor D is preferably mounted in a tight stainless steel housing. The inductive coil may be placed in the open side of a ferrite cap, a metal plate being placed on the opened (working) surface of this cap, said surface forming the front working plane of the sensor D.

In accordance with a preferred feature of the invention, the state of the LC circuit is defined by a switching means SM1 able to mutually connect or disconnect from each other the capacity C and the coil L, said switching means SM1 being driven by a periodical, for example rectangular or square, pulse signal with a predefined period T.

Advantageously, the capacity C is connected to the opposite terminals of a DC voltage source S adapted to ensure its repeated charge during the first state durations of the LC circuit, a resistance R' being possibly serial connected between said source S and said capacitance C, said resistance R' possibly being the resistance of any component of said circuit or the sum of several of such resistances (switch, connections, . . . ).

AS shown in the FIGS. 2A and 2B, the sensor D can be designed with a single switching means SM1 controlling charge and discharge of the capacity C.

Alternatively, as shown in FIG. 1, the sensor D can comprise a second switching means SM2 able to mutually connect and disconnect from each other the source S and the capacitance C, said second switching means SM2 being driven in antiphase in comparison with the switching means SM1 connecting/disconnecting capacity C and coil L.

Said sensor D is then operated as follows:

SM2 closed and SM1 open: C is charging (first state of the LC circuit),

SM2 open and SM1 closed: C is discharging through L (second state of the LC circuit)

In accordance with preferred features of the invention, the value of the capacity C and, should the case occur, the value of the resistance R' is (are) defined in such a way that the RC-constant, where R is the sum of the internal resistances of a source S and of the capacitance C with possibly the separate resistance R', is several times smaller than the pulse signal period T.

More precisely, and in relation to practical embodiments of the sensor D, the RC-constant is 2 to 10 times, preferably 3 to 5 times, smaller than the pulse signal period T.

In order to provide the most accurate measurements, the given moment at which the voltage amplitude measurement is performed at the opposite terminals of the coil or inductance L corresponds approximately to the maximum absolute amplitude value of the second or any further completely formed alternation of the decaying oscillating voltage signal recorded during a second state duration at said terminals, when the amplitude values are still important.

The rank of the concerned alternation for measurement purposes in connection with the invention is preferably a compromise between a significant amplitude value and a reliable modulation depth, which becomes better as the rank of the considered alternation increases.

In practice, the measurements can be done between the second and the fourth absolute maximum value.

At that time, the transitional phenomena have disappeared and the LC or LRC circuit oscillates in a stable mode, which can be identically reproduced, and the amplitude decrease follows a pure exponential function.

Figure 4:
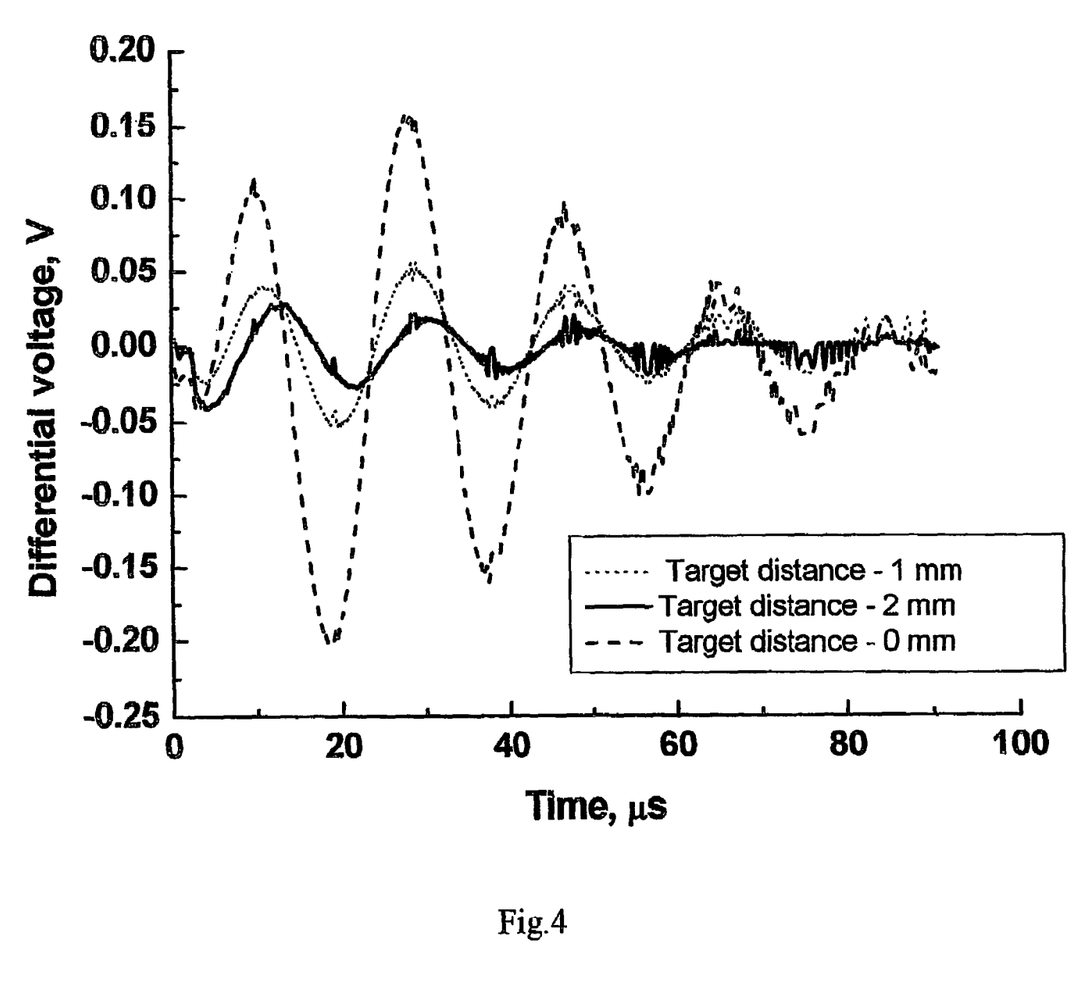
FIG. 4 graphically illustrates the differential voltage signals (difference between a reference voltage without object and voltages with an object at various distances from the sensor) measured during second state phases of the LRC circuit of FIG. 2B, as a function of time counted from the beginning of the second state phases.
Figure 5:
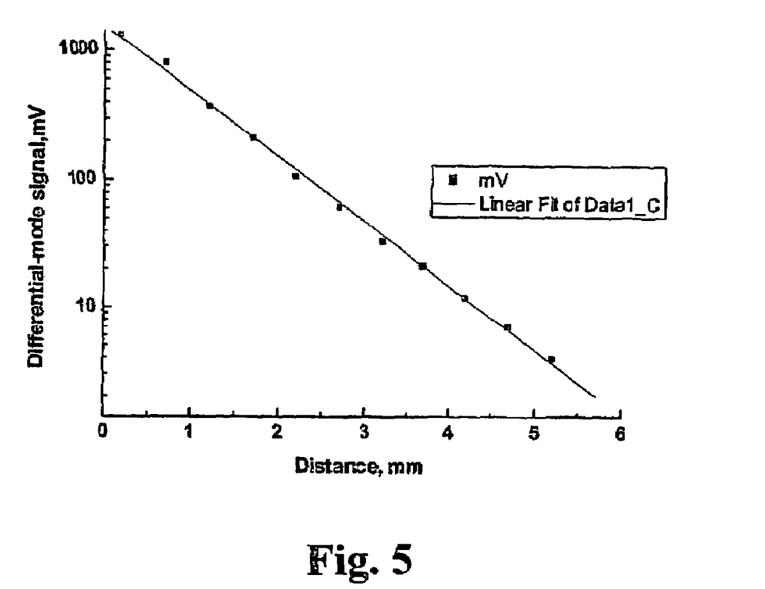
FIG. 5 (logarithmic scale) graphically illustrates the distance of an object as an exponential function of the differential mode signal obtained at the predefined moment after closure of switching means SM1 (i.e. counted from the beginning of the second state phase), FIG. 6 graphically illustrates the delay for measurement as a function of the modulation grade of the periodic signal driving the switching means SM1 of FIGS. 2A and 2B, and FIGS. 7A and 7B show oscillograms of voltages of two LC circuits.
Figure 6:
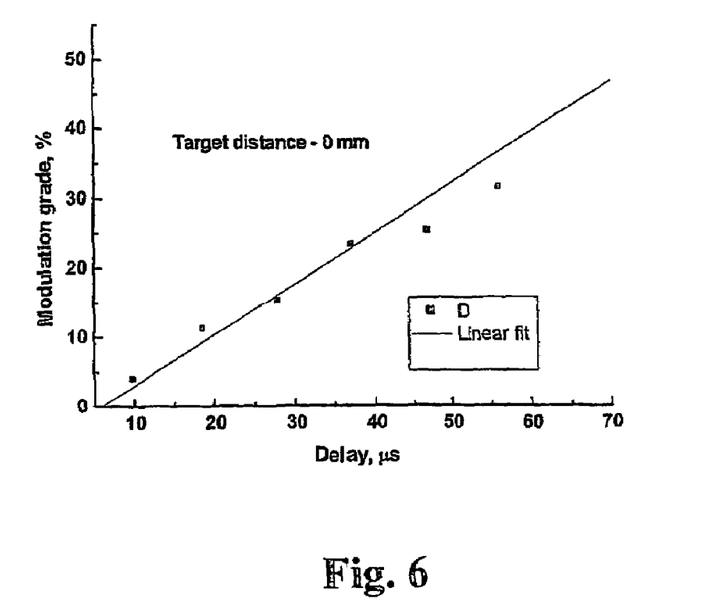

As can be noticed from FIGS. 4 and 5 of the drawings, the recorded voltage signal at the terminals of the coil L is advantageously used to produce a differential signal (difference of coil voltages without and with an object or body in the proximity of the sensor) on which the topical voltage measurement can be performed. Said measured value is then transformed by the processing means SP into a linear value allowing to deduct the distance of the given object using a prerecorded linear function as shown by way of example on FIG. 5.

According to a further development of the invention, the delay DM for performing the measurement of the voltage value at the coil or inductance L opposite terminals, after switching of the LC or LRC circuit from its first state to its second state is computed using the time dependency of the modulation depth or grade, in order to optimise its value based on a linear function Modulation grade $M = f(\text{delay})$, wherein $$M(\%) = 100 \times \frac{|U_{L0}(t) - U_{L1}(t)|}{U_{L0}(t)},$$

$U_{L0}(t)$ being the coil voltage without any influence, and
$U_{L1}(t)$ being the coil voltage with an object or body within the detection area and influencing said voltage.

Figure 3:
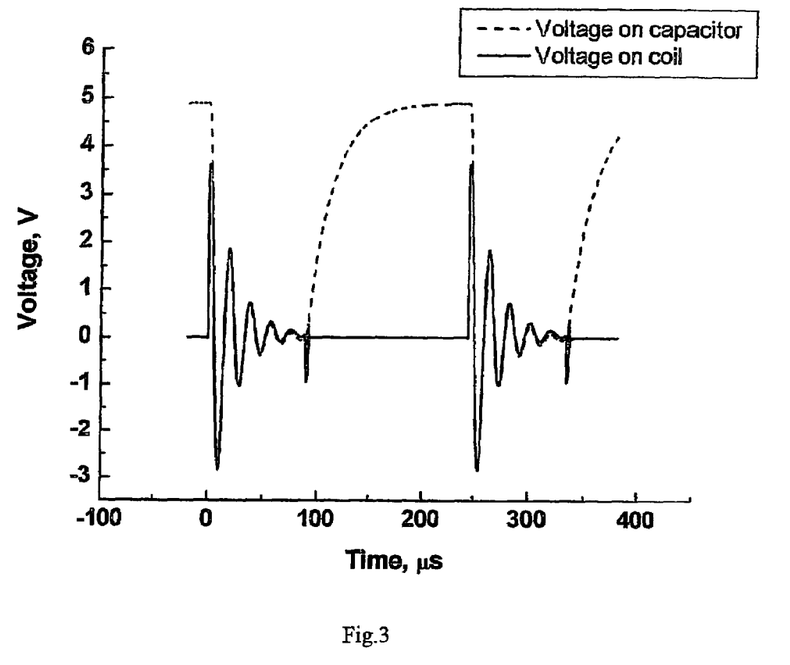
FIG. 3 shows oscillograms of the voltage on the capacity and of the voltage on the coil of the LC circuit of FIGS. 2A and 2B, during consecutive first and second states.

The graphs of the FIGS. 3 to 5 have been obtained with a sensor D having the following particulars: DC voltage of the source S: 5 V; R'=200Ω, C=0.1 µF, L=0.14 mH.

As can be seen from FIG. 3 of the drawings the oscillation frequency of the LC or LRC circuit is preferably comprised between 10 kHz and 50 kHz, whereas the repetition frequency or switching frequency is comprised between 2 kHz and 10 kHz, the ratio between said frequencies being comprised between ¼ and ⅙, preferably being around ⅕.

The coil L had a diameter of 5.6 mm and an internal resistance of 2.6Ω. Said coil was placed in a ferrite structure with an external diameter of 7, 25 mm. All the components were mounted in a stainless steel non magnetic housing with a front wall which was 1 mm thick (active surface of the sensor D) and the sensor D was used in a flush mounted configuration.

The inductive proximity sensor D can non limitatively be used:
for sensing the presence and the distance of a given ferromagnetic or non-ferromagnetic metal object or body in a pre-set detecting area, and/or
for sensing and distinguishing objects or bodies made of or at least partly covered with various ferromagnetic and/or non-ferromagnetic metallic materials and present in a pre-set detecting area.

Figure 4A:
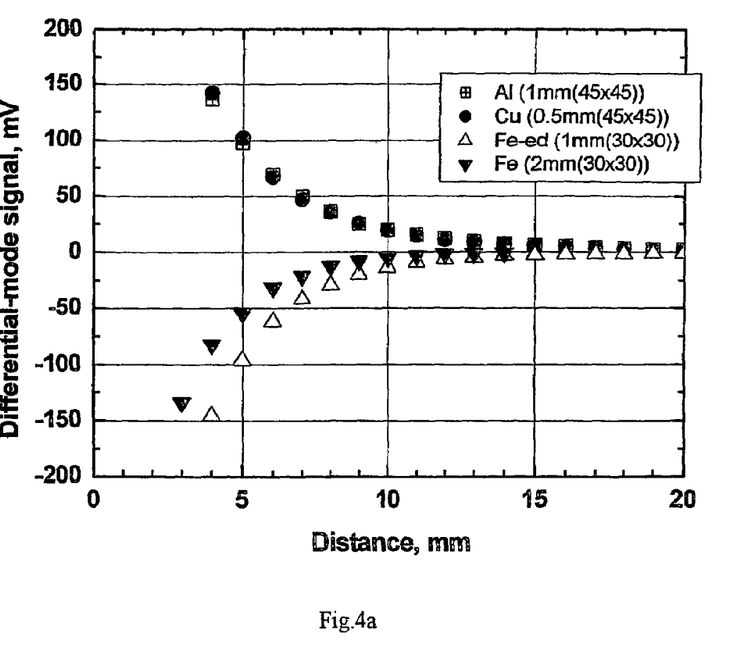
FIG. 4a graphically illustrates the differential mode signal produced by the sensor as a function of the distance of objects made of various metals to the sensitive face of said sensor, said figure showing that the signals from magnetic and non magnetic targets are of opposite polarities and decrease exponentially with the distance between the sensor and the concerned object.

The person skilled in the art will understand, especially when looking at FIG. 4A, that for objects or bodies B mode of non-ferrous metals the resulting effect is opposite, i.e. the amplitude of the voltage at the coil L is increasing with said objects or bodies approaching the active end of face of the sensor D.

The repeatedly acquired information about (an) object(s) or body(ies), in particular moving ones, located in the sensing or detection area of the sensor can be exploited either to give continuously data about the concerned object or body (distance, type of material, . . . ) or to issue binary data (by comparing the continuously acquired data to a threshold value).

Thus, the present invention proposes an inductive sensor in a metal housing, based on a pulse oscillation technology.

The present invention is, of course, not limited to the preferred embodiments described and represented herein, changes can be made or equivalents used without departing from the scope of the invention.

The invention claimed is:

1. Inductive proximity sensor comprising:
an inductive coil defining a front working plane of the sensor, said front working plane forming an active surface or end of the sensor, said inductive coil being associated with a covering plate or a plane part of a housing of said sensor, said plate or part being made of a non magnetic metal with low electrical conductivity and said plate or part being disposed perpendicularly to an axis of the coil and parallel to the front working plane, and thus forming part of an equivalent magnetic circuit;
means for supplying the coil repeatedly with current;
means for processing signals which correspond to voltages induced in said coil when fed, said voltages being influenced by the presence of an object or body within a given detection area, depending on a distance of said object from the detection area and on a material constituting said object, and said coil being part of a parallel LC circuit;
wherein said means for supplying comprises a capacitor of the LC circuit,
wherein the LC circuit is repeatedly switched between two states, namely a first state in which the coil is disconnected from the capacitor and said capacitor is charged and a second state in which the coil is connected to the capacitor and said capacitor discharges through said coil, the LC circuit being allowed to freely oscillate while in said second state and until a following change of state, and thus an oscillating voltage signal of said voltages is modified by the object located within the detection area,
wherein a voltage oscillating signal amplitude measurement is performed at a certain predefined point of said voltage signal after each switching from the first to the second state and a result of said measurement is computed in connection with reference measurements in order to calculate at least one of a distance to the front working plane, a nature of the material constituting the object, and a mass indicative value of the object or body located within the detection area, and
wherein a delay for performing the measurement of a voltage value at coil opposite terminals, after switching of the LC circuit or an LRC circuit from its first state to its second state is computed using time dependency of modulation grade, in order to optimize the delay based on a linear function Modulation grade $M = f(\text{delay})$, wherein $$M(\%) = 100 \times \frac{|U_{L0}(t) - U_{L1}(t)|}{U_{L0}(t)},$$

$U_{L0}(t)$ being the coil voltage without any influence, and
$U_{L1}(t)$ being the coil voltage with an object or body within the detection area and influencing said voltage.

2. Inductive proximity sensor comprising:

an inductive coil defining a front working plane of the sensor, said front working plane forming an active surface or end of the sensor, said inductive coil being associated with a covering plate or a plane part of a housing of said sensor, said plate or part being made of a non magnetic metal with low electrical conductivity and said plate or part being disposed perpendicularly to a coil axis and parallel to the front working plane, and thus forming part of an equivalent magnetic circuit;

means for supplying the coil repeatedly with current;

means for processing signals which correspond to voltages induced in said coil when fed, said voltages being influenced by the presence of an object or body within a given detection area, depending on a distance of said object from the detection area and on a material constituting said object, and said coil being part of a parallel LC circuit;

wherein said means for supplying comprises a capacitor of the LC circuit, wherein the LC circuit is repeatedly switched between two states, namely a first state in which the coil is disconnected from the capacitor and said capacitor is charged and a second state in which the coil is connected to the capacitor and said capacitor discharges through said coil, the LC circuit being allowed to freely oscillate while in said second state and until a following change of state, and thus an oscillating voltage signal of said voltages is modified by the object located within the detection area, wherein a voltage oscillating signal amplitude measurement is performed at a certain predefined point of said voltage signal after each switching from the first to the second state and a result of said measurement is computed in connection with reference measurements in order to calculate at least one of a distance to the front working plane, a nature of the material constituting the object, and a mass indicative value of the object or body located within the detection area, wherein a change of state of the LC circuit is controlled by a first switching means able to mutually connect or disconnect from each other the capacitor and the coil, said first switching means being driven by a periodical pulse signal with a predefined period, and wherein a delay for performing the measurement of a voltage value at coil opposite terminals, after switching of the LC circuit or an LRC circuit from its first state to its second state is computed using the time dependency of modulation grade, in order to optimize the delay based on a linear function Modulation grade $M = f(\text{delay})$, wherein $$M(\%) = 100 \times \frac{|U_{L0}(t) - U_{L1}(t)|}{U_{L0}(t)},$$

$U_{L0}(t)$ being the coil voltage without any influence, and
$U_{L1}(t)$ being the coil voltage with an object or body within the detection area and influencing said voltage.

3. Inductive proximity sensor comprising:

an inductive coil defining a front working plane of the sensor, said front working plane forming an active surface or end of the sensor, said inductive coil being associated with a covering plate or a plane part of a housing of said sensor, said plate or part being made of a non magnetic metal with low electrical conductivity and said plate or part being disposed perpendicularly to a coil axis and parallel to the front working plane, and thus forming part of an equivalent magnetic circuit;

means for supplying the coil repeatedly with current;

means for processing signals which correspond to voltages induced in said coil when fed, said voltages being influenced by the presence of an object or body within a given detection area, depending on a distance of said object from the detection area and on a material constituting said object, and said coil being part of a parallel LC circuit;

wherein said means for supplying comprises a capacitor of the LC circuit, wherein the LC circuit is repeatedly switched between two states, namely a first state in which the coil is disconnected from the capacitor and said capacitor is charged and a second state in which the coil is connected to the capacitor and said capacitor discharges through said coil, the LC circuit being allowed to freely oscillate while in said second state and until a following change of state, and thus an oscillating voltage signal of said voltages is modified by the object located within the detection area, wherein a voltage oscillating signal amplitude measurement is performed at a certain predefined point of said voltage signal after each switching from the first to the second state and a result of said measurement is computed in connection with reference measurements in order to calculate at least one of a distance to the front working plane, a nature of the material constituting the object, and a mass indicative value of the object or body located within the detection area, wherein the capacitor is connected to the opposite terminals of a DC voltage source adapted to ensure its repeated charge during first state durations of the LC circuit, a resistance being optionally serial connected between said source and said capacitor, and wherein a delay for performing the measurement of a voltage value at coil opposite terminals, after switching of the LC circuit or an LRC circuit from its first state to its second state is computed using the time dependency of modulation grade, in order to optimize the delay based on a linear function Modulation grade $M = f(\text{delay})$, wherein $$M(\%) = 100 \times \frac{|U_{L0}(t) - U_{L1}(t)|}{U_{L0}(t)},$$

$U_{L0}(t)$ being the coil voltage without any influence, and $U_{L1}(t)$ being the coil voltage with an object or body within the detection area and influencing said voltage.

4. Inductive proximity sensor according to claim 2, further comprising a second switching means able to mutually connect and disconnect from each other the source and the capacitor, said second switching means being driven in antiphase in comparison with the first switching means.

5. Inductive proximity sensor according to claim 2, wherein a capacitance of the capacitor and, optionally, a resistance is defined in such a way that a RC-constant, where R is a sum of internal resistances of a source and of the capacitor with optionally the resistance, is several times smaller than the pulse signal period.

6. Inductive proximity sensor according to claim 5, wherein the RC-constant is 2 to 10 times, smaller than the pulse signal period.

7. Inductive proximity sensor according to claim 1, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

8. Inductive proximity sensor according to claim 1, wherein said sensor is mounted in a stainless steel housing.

9. Inductive proximity sensor according to claim 2, wherein the capacitor is connected to the opposite terminals of a DC voltage source adapted to ensure its repeated charge during the first state durations of the LC circuit, a resistance being optionally serial connected between said source and said capacitor.

10. Inductive proximity sensor according to claim 2, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

11. Inductive proximity sensor according to claim 3, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

12. Inductive proximity sensor according to claim 4, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

13. Inductive proximity sensor according to claim 5, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

14. Inductive proximity sensor according to claim 6, wherein a given moment at which the voltage amplitude measurement is performed at opposite terminals of the coil corresponds approximately to −a maximum absolute amplitude value of a second or any further completely formed alternation of a decaying oscillating voltage signal recorded during a second state duration at said terminals.

* * * * *

UNITED STATES PATENT AND TRADEMARK OFFICE
CERTIFICATE OF CORRECTION

PATENT NO. : 7,586,303 B2
APPLICATION NO. : 11/090161
DATED : September 8, 2009
INVENTOR(S) : Kirchdoerffer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 743 days.

Signed and Sealed this

Fourteenth Day of September, 2010

David J. Kappos
*Director of the United States Patent and Trademark Office*